United States Patent
Daikoku et al.

[11] Patent Number: 5,818,694
[45] Date of Patent: Oct. 6, 1998

[54] COOLING APPARATUS FOR ELECTRONIC DEVICES

[75] Inventors: Takahiro Daikoku, Ushiku; Shigeyasu Tsubaki, Hadano, both of Japan

[73] Assignee: Hitachi, Ltd., Tokyo, Japan

[21] Appl. No.: 800,460

[22] Filed: Feb. 14, 1997

[30] Foreign Application Priority Data

Feb. 16, 1996 [JP] Japan ........................... 8-28938

[51] Int. Cl.$^6$ ........................................... H05K 7/20
[52] U.S. Cl. .................... 361/703; 361/689; 361/697; 361/699; 361/709; 257/707; 257/714; 257/722; 257/719; 174/16.3; 165/80.3
[58] Field of Search .................... 361/703, 709, 361/710, 704; 257/706, 707, 712, 713, 717, 718, 719, 722; 174/15.1, 16.3; 165/80.3

[56] References Cited

U.S. PATENT DOCUMENTS 5,097,385  3/1992  Chao-Fan Chu et al. .............. 361/703
5,191,511  3/1993  Sawaya ................................... 361/703

OTHER PUBLICATIONS

Japan Society of Mechanical Engineers (JSME) Data Book, "Heat Transfer" (4th Edition) (1989), p. 206.

Primary Examiner—Leo P. Picard
Assistant Examiner—Boris L. Chervinsky
Attorney, Agent, or Firm—Fay, Sharpe, Beall, Fagan, Minnich & McKee

[57] ABSTRACT

The cooling apparatus has cooling fins attached to heat generating units of electronic devices and provided with a plurality of elemental fins. According to one embodiment, the cooling apparatus has a first cooling fin composed of elemental fins that are uniform in fin density in the height direction of the cooling fin from a fin base. The cooling apparatus also has a second cooling fin composed of elemental fins with a zero or small fin density at the lower portion close to a fin base of the cooling fin as compared with the fin density at the upper portion of the cooling fin. The first and second cooling fins are positioned adjacent to one another. Various different embodiments of cooling fins are disclosed.

14 Claims, 8 Drawing Sheets

COOLING APPARATUS FOR ELECTRONIC DEVICES

FIELD OF THE INVENTION

The present invention relates to a cooling apparatus for electronic devices. The cooling apparatus includes cooling fins that are mounted on heat generating units, such as semiconductor devices, and a cooling fluid is forced to flow through the cooling fins so as to enable cooling of a large number of these semiconductor devices efficiently.

BACKGROUND OF THE INVENTION

It is known in the prior art to employ cooling fins on a printed circuit board or a multi-layer ceramic board through which a refrigerant, such as air, is passed through in a sideways manner. For example, as described on page 206 of the Japan Society of Mechanical Engineers (JSME) Data Book entitled "Heat Transfer" (4th Edition) (1989), the cooling fins usually employed include elemental fins arranged to have a uniform fin density as measured in a vertical direction of the fin. In other words, elemental fins are uniformly provided along the entire height of the fin.

The present inventors have discovered that this conventional method taught above suffers several problems. First of all, the temperature of the cooling fluid flowing out from the cooling fin is higher on the downstream side due to convection heat transfer from the heat generating semiconductor packages, so that the closer to the downstream side the semiconductor device position is, the higher the temperature thereof. Also, the flow of a cooling fluid through a cooling fin positioned closer to the downstream side is obstructed by a cooling fin positioned closer to an upstream side, thereby decreasing fluid inflow velocity. This exerts a greater influence on the central area of the cooling fin than on the peripheral area thereof.

On the other hand, circuit boards mounting a large number of heat generating semiconductor packages, or the like, thereon are usually arranged side by side. Therefore, a space is usually provided above each circuit board so that the components on one circuit board do not collide with an adjacent circuit board at the time of insertion or removal of the circuit boards. Consequently, the flowing velocity distribution of the cooling fluid in a cooling flow path defined by the circuit boards is of a lower flow velocity on the lower layer side closer to the component mounting surfaces of the circuit boards with a large number of heat generating semiconductor packages thereon than on the upper layer side, which is spaced apart from the component mounting surfaces. This is due to the resistance of the circuit components to the flow.

As a result, in a conventional cooling apparatus for an electronic device having cooling fins, if a large number of cooling fins are arranged in the flowing direction of a cooling fluid, the velocity of cooling fluid flowing near the cooling fin bases, where the temperature is to be reduced, is slow and the temperature is high. At the same time, the velocity of the cooling fluid flowing near the upper ends of the cooling fins, that are low in temperature, is fast and the temperature is low. Thus, a limit is encountered in attempting to improve the cooling performance of the cooling fins.

Particularly, the higher the mounting density of the heat generating semiconductor components, the stronger the effect of the above-mentioned phenomenon. In the past, in order to eliminate this problem, means have been developed for increasing the flow rate or flow velocity of the cooling fluid.

Furthermore, in a computer or similar device which requires high processing speeds, there recently has been adopted a method of mounting LSIs (Large Scale Integrated Circuits) in high density. As a result, the generated heat flux and the total heat dissipation of the LSI devices are increasing remarkably due such high integration of semiconductor circuits. For this reason it is becoming more and more important to cool LSIs efficiently.

Even under such high density mounting circumstances, there exists a keen demand for adopting the above-mentioned cooling method due to its simple structure. However, if the conventional cooling technique is applied to such a high density electronic device as referred to above, the following problems, in addition to the problems mentioned above, will arise.

First, in order to increase the flow rate or flow velocity of the cooling fluid, a large capacity fluid machine, such as a large capacity fan or blower, must be used to overcome the pressure resistance felt by the cooling fluid due to the high-density mounting of semiconductor devices. The larger the capacity, the larger the electric power and space required. Also, noise generated from the fluid machine increases remarkably.

Second, the cooling air which flows out from each cooling fin and which is high in temperature does not readily mix with the cooling air which is flowing around the cooling fin and which is relatively low in temperature. Consequently, the higher the heat dissipation of the semiconductor devices and the higher the arrangement density and the number of the devices adjacent one another, the more the cooling performance deteriorates for the semiconductor devices located in downstream positions. Thus, it is difficult to maintain the temperatures of many of the semiconductor devices within an allowable temperature range.

Third, in general, semiconductor packages are mounted on a circuit board such as a printed circuit board or a multi-layer ceramic board and cooling fins are mounted thereon. A relatively wide space is ensured around each cooling fin placed in a cooling flow path. Accordingly, if a cooling fin having a larger number of elemental fins is used for the purpose of improving the cooling performance for the semiconductor packages, the flow rate of cooling fluid entering the whole cooling fin area decreases and hence the cooling performance of the elemental fins is deteriorated. That is, the pressure resistance of the cooling fin itself increases and the cooling fluid flows toward the surrounding wide space. This creates a limit with respect to optimization involving increasing of the number of elemental fins. As a result, even if the flow rate of cooling fluid flowing through the cooling flow path is increased, the cooling performance of the entire cooling fin cannot be improved in proportion to the flow rate of the cooling fluid.

Fourth, when many semiconductor packages with cooling fins attached thereto are mounted on a circuit board, not only are the semiconductor packages located on the downstream side influenced by a rise in temperature of the cooling fluid flowing out from the cooling fins disposed on the upstream side, but the flow of cooling fluid entering the downstream cooling fins is also obstructed by the upstream cooling fins and hence the cooling performance is further deteriorated. In particular, the base portions of high-temperature elemental fins should be cooled by a large flow rate of cooling fluid that is low in temperature, but nonetheless the flow of cooling fluid is significantly deteriorated at the base portions of high-temperature elemental fins rather than at their upper end portions. Furthermore, in the case where the upstream cooling fins and the downstream cooling fins are of the same shape, the flow of cooling fluid entering the downstream cooling fins is greatly obstructed.

Thus, the prior art does not teach a way to improve the cooling performance for many semiconductor integrated circuit devices, LSIs, mounted in a high density on a circuit board such as a printed circuit board or a multi-layer ceramic board, in order to restrict the rise of temperature within an allowable temperature range. Also, the prior art does not teach a way to reduce the capacity of a fluid machine such as a fan or a blower, in order to obtain additional power saving, space saving, and reduction of noise.

SUMMARY OF THE INVENTION

The present invention solves the above-mentioned problems and in addition has an object to provide a cooling apparatus for an electronic device that is capable of cooling heat generating units effectively so as to permit the rise in temperature of the heating units to be within an allowable temperature range, even in the case of heat generating units which produce heat at a high temperature such as semiconductor integrated circuit devices, or LSIs, which are mounted in high density and in a large number on a circuit board. Specifically, with respect to a multi-chip module with a large number of LSI chips mounted thereon in high density, another object of the present invention is to provide a cooling apparatus for heating units that is capable of suppressing the rise in temperature of the LSI chips uniformly by the use of an easily available refrigerant such as air even if the LSI chips have different heat dissipation.

It is another object of the present invention to provide a cooling apparatus for an electronic device that is capable of effecting cooling without employing a large quantity of a cooling fluid that is poor in cooling efficiency. Instead, the present invention makes it possible to use a smaller capacity fluid machine, such as a fan or a blower, in order to obtain power saving, space saving and the reduction of noise.

A still further object of the present invention is to provide a cooling apparatus for an electronic device having cooling fins of a simple structure.

According to the present invention, in order to achieve the above-mentioned objects, there is provided a cooling apparatus for an electronic device which cools heat generating units of the electronic device through cooling fins attached to the heat generating units, where each cooling fin is composed of many elemental fins. A large number of cooling fins are arranged in the flowing direction of a cooling fluid and are each mounted to a heat generating unit. At least one of the cooling fins has a zero or small elemental fin density at a lower portion thereof, close to its fin base, as compared with its elemental fin density at an upper portion thereof.

Another feature of the present invention is that a first cooling fin having a uniform cooling fin density in the height direction thereof from its fin base, and a second cooling fin having a zero or small elemental fin density at a lower portion thereof, close to its fin base, as compared with an elemental fin density thereof at its upper portion, are mounted alternately in the flowing direction of a cooling fluid.

A further feature of the present invention is that a first cooling fin having a large number of parallel, rectangular elemental fins provided perpendicularly to a fin base thereof, and a second cooling fin having a large number of parallel, rectangular elemental fins parallel to a fin base thereof and mounted to a support fin erected perpendicularly to the fin base, are mounted in an alternate manner. Moreover, a cooling fluid is caused to flow sideways in parallel with the first cooling fin or vertically from above.

A still further feature of the present invention resides in that a first cooling fin having a large number of parallel, rectangular elemental fins provided perpendicularly to a fin base thereof, and a second cooling fin having a large number of parallel, rectangular elemental fins in parallel with a fin base thereof which elemental fins are mounted to a supported erected perpendicularly to the said fin base, are mounted alternately in the flowing direction of a cooling fluid. Moreover, the parallel, rectangular elemental fins of the second cooling fin are zero or small in fin density, or wide in fin spacing, or small in fin thickness, at a lower portion of the cooling fin close to the fin base as compared with the elemental fin density at an upper portion of the cooling fin.

These and other objects, features and advantages of the present invention will become more apparent in view of the following detailed description of the preferred embodiments in conjunction with the drawings.

DETAILED DESCRIPTION OF THE PREFERRED EMBODIMENTS

A first embodiment of the present invention will be described below in detail with reference to FIGS. 1 and 2.

Figure 1:
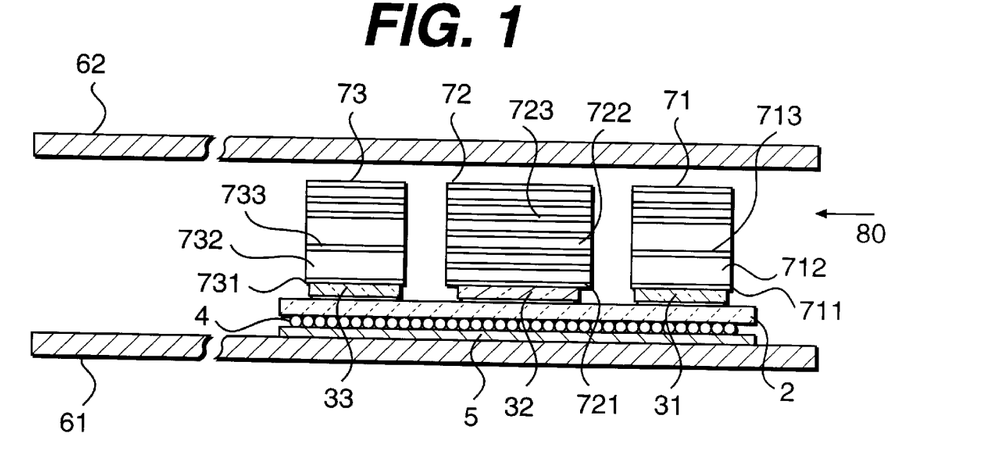
FIG. 1 is a vertical sectional view of a cooling apparatus for an electronic device according to a first embodiment of the present invention.
Figure 2:
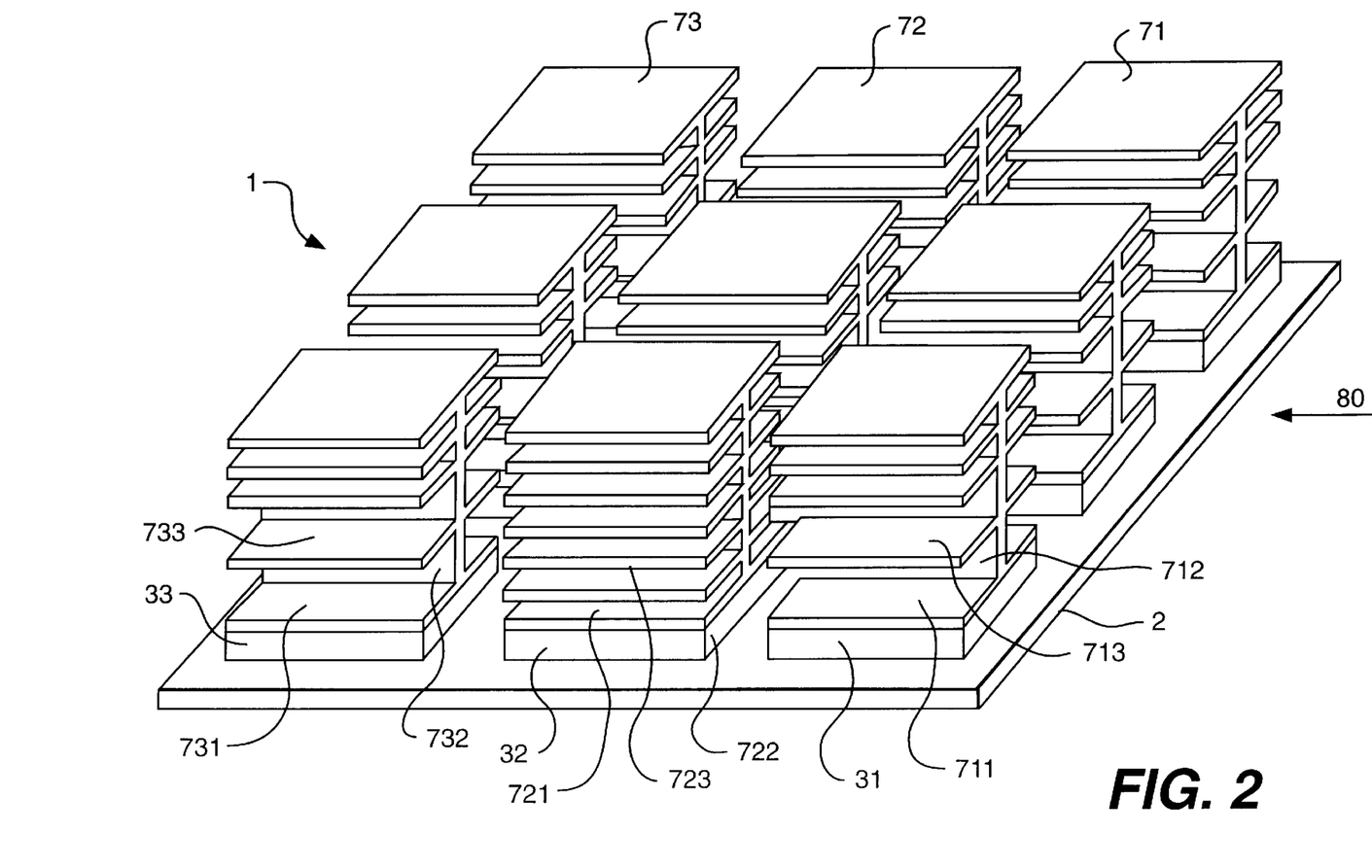
FIG. 2 is a perspective view showing a large number of semiconductor devices mounted on a multi-chip module, with cooling fins being mounted onto the semiconductor devices.

FIG. 1 is a sectional view of a cooling apparatus for an electronic device to which the present invention is applied, and FIG. 2 is a perspective view of the electronic device shown in FIG. 1. In these figures, the electronic device illustrated is a multi-chip module mounting a large number of semiconductor devices incorporating LSI chips which generate a high heat dissipation as heat generating units.

In the multi-chip module shown in FIG. 1, semiconductor devices 31, 32 and 33 containing LSI chips are mounted on a multi-layer ceramic circuit board 2. Circuit board 2 is mounted to a socket 5 on a printed circuit board 61 through a plurality of micropins 4.

As shown in FIG. 2, the semiconductor devices are arranged in three rows by three columns. The direction of flow of the cooling fluid is illustrated by an arrow 80 in FIGS. 1–5. The semiconductor devices closest to arrow 80 are referred to as most upstream, while those furthest away are referred to as most downstream. In other words, arrow 80 defines a direction of flow from an upstream point to a downstream point.

Figure 3:
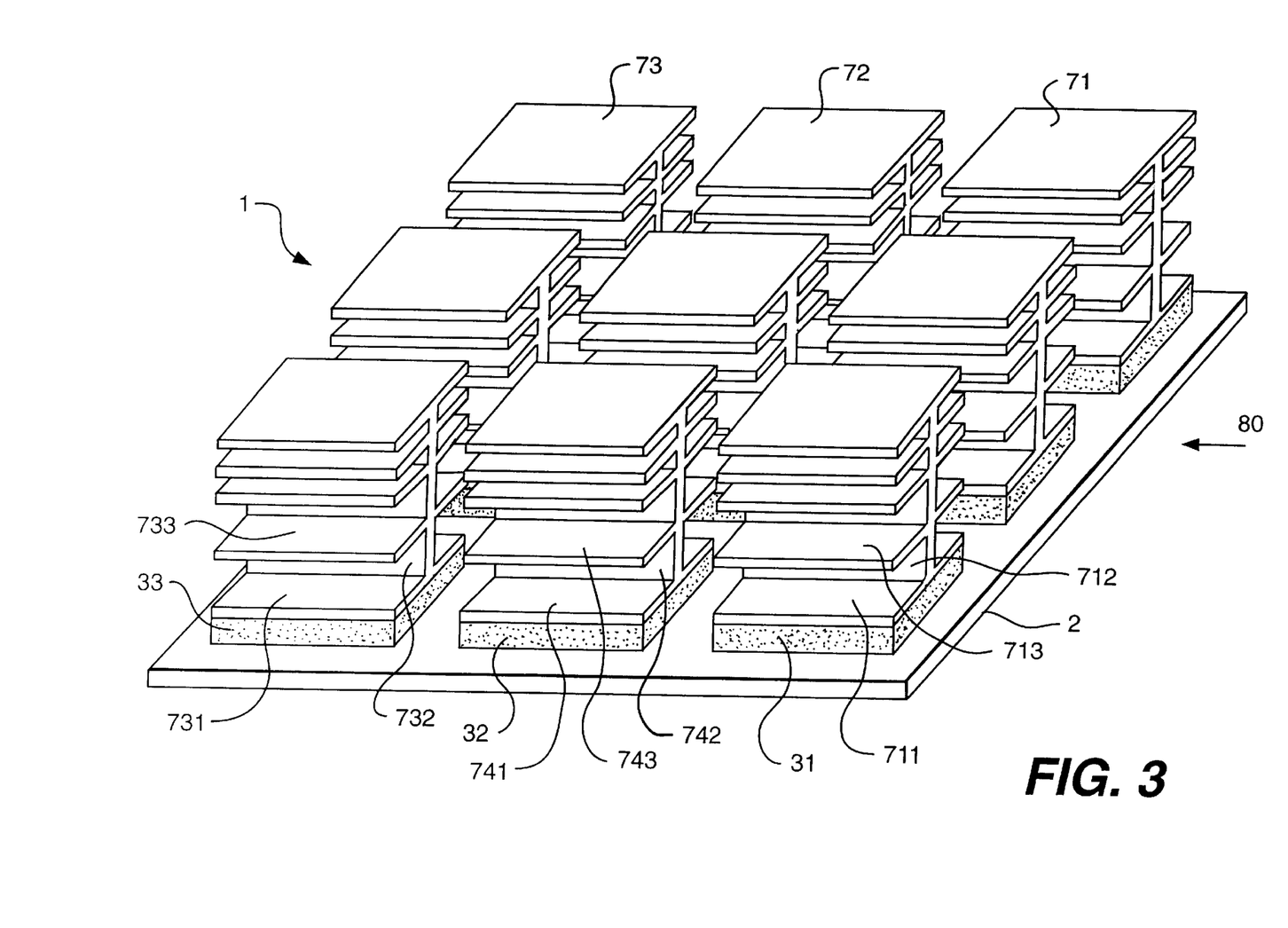
FIG. 3 is a perspective view of a cooling apparatus for an electronic device according to a second embodiment of the present invention, in which cooling fins are mounted onto a large number of semiconductor devices mounted on a multi-chip module.

In FIGS. 1–3, cooling fins 71 and 73 are mounted respectively to the most upstream and most downstream semiconductor devices 31 and 33. Each column of cooling fins 71 (73) is composed of a fin base 711 (731), a support fin 712 (732) erected perpendicularly to the said fin base, and a large number of rectangular elemental fins 713 (733) mounted parallel to the fin base. The mounting density of the elemental fins is smaller at the lower portion of the support fin which is closest to the fin base as compared to the upper portion of the support fin. In other words, fewer elemental fins are positioned at the lower portion of the support fin. If the support fin is divided into an upper half and a lower half, the fin density in the upper half would be greater than the fin density in the lower half. Of course, as will be discussed later, the lower half can be provided without any elemental fins at all.

Similarly, cooling fins 72 mounted to the central column of semiconductor devices 32 are each composed of a fin base 721, a support fin 722 erected perpendicularly to the fin base, and a large number of elemental fins 723 mounted parallel to the fin base. The elemental fins 723 are mounted in uniform density. In this embodiment, since the amount of heat generated from the central column of semiconductor devices 32 is larger than that generated from the most upstream and most downstream columns of semiconductor devices 31, 33, a large number of elemental fins 723 are mounted uniformly to the support fin 722 to enhance cooling capacity.

Furthermore, to insure that, at the time of inserting or removing the printed circuit board 61 from the apparatus, the cooling fins 71, 72 and 73 do not strike against the back of a printed circuit board 62, disposed above and in parallel with the printed circuit board 61, the upper portions of those cooling fins and the back of the printed circuit board 62 are spaced from each other. In other words, a certain amount of space is provided above the cooling fins.

According to the embodiment described above, when the cooling fluid flowing (as indicated with arrow 80) between the printed circuit boards 61 and 62 enters the interior of each cooling fin 71 located on the most upstream side, the flow resistance encountered by the cooling fluid as it enters between adjacent elemental fins 713 is greater at the upper portion of the support fin 712 and smaller at the lower portion. Consequently, the rate of flow of the cooling fluid entering between adjacent elemental fins 713 located at the lower portion close to the fin base 711 is faster than at the upper portion. As a result, the rise in temperature of the cooling fluid flowing out from the cooling fin 71, after heat-exchange with the elemental fins 713, is smaller at the lower portion close to the fin base 711.

As a result of the arrangement of cooling fins 71, the central column of cooling fins 72 permits a high flow rate of a cooling fluid that is low in temperature to flow along the elemental fin 723 located near the fin base where temperature reduction is needed. In addition, at each of the downstream-side cooling fins 73, the mounting density of the elemental fins 733 is greater at the upper portion of the support fin 732 and smaller at the lower portion of the support fin 732, so that the flow resistance of the cooling fluid passing the elemental fin 733 near the fin base of the downstream side of cooling fin 73 is lower than that at the upper portion. This permits and increased flow rate of cooling fluid for the elemental fin 723 located near the fin base. Consequently, cooling fin 72 is cooled efficiently. Also, the rise in temperature of the cooling fluid flowing out from elemental fin 723 near the fin base of the cooling fin 72 is kept to a minimum.

Because the rise in temperature of the cooling fluid passed through the upstream-side cooling fins 71 and 72 is averaged and kept low throughout the whole cooling fin area, the most downstream-side cooling fins 73 can be cooled efficiently. Consequently, the cooling fins 71, 72 and 73 can be uniformly cooled along a vertical direction from the chip mounting surface of the multi-chip module 1. More particularly, the most upstream and downstream cooling fins 71, 73 take away heat mainly through the upper elemental fins 713 and 733 on the support fins 712 and 732, respectively, while the central cooling column of cooling fins 72 take away most of its heat through the lower elemental fins 723 on the support fin 722. Thus, the cooling fins 71, 72 and 73 efficiently utilize the cooling fluid flowing between the printed circuit boards 61 and 62 and can perform cooling while minimizing the differences in temperature. Although, in the embodiment described above, the mounting density of the elemental fins at the central column is set to be uniform, the cooling fin may instead be replaced with one similar to the most upstream and downstream columns of cooling fins depending upon the quantity of heat generated from the semiconductor devices. Even if this is done, the same effect as discussed above can be realized.

Figure 9:
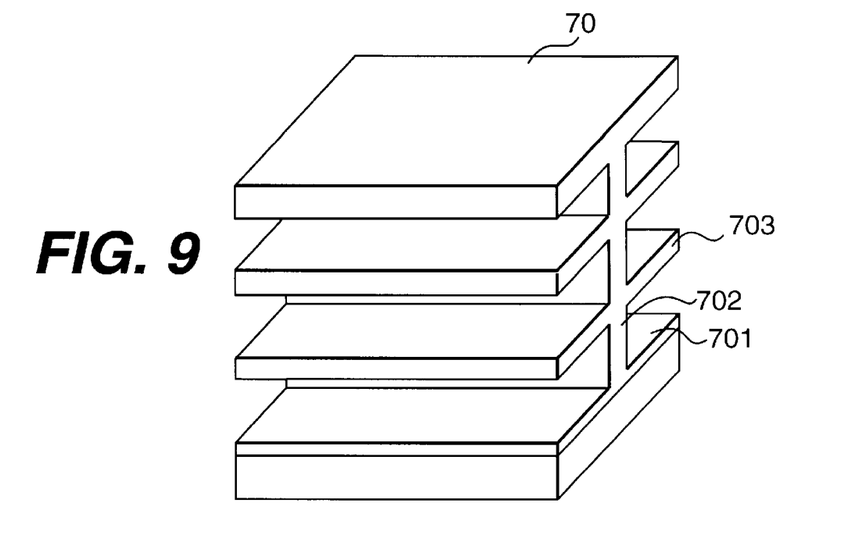
FIG. 9 is a perspective view of a cooling fin in which many of the fins illustrated in the first embodiment of the present invention have been modified.

Furthermore, although in the embodiment described above, the mounting density of the elemental fins which are uniform in thickness is smaller at the lower portion of the support fin close to the fin base in comparison with that at the upper portion, the thickness of the elemental fins at the lower portion may be made smaller or the spacing between them may be rendered wider. Alternatively, as shown in FIG. 9, the fin pitch of the elemental fins 703 may be constant.

Referring now to FIG. 3, a modification of the embodiment illustrated in FIG. 2 will now be described according to a second embodiment of the present invention. In this second embodiment, the portions similar to those in FIG. 2 are indicated by the same reference numerals and explanation of such portions will be omitted.

As shown in FIG. 3, the cooling fins 74 attached to the central column of semiconductor devices 32 are of the same construction and shape as the most upstream and downstream columns of cooling fins 71, 73. The semiconductor devices 31, 32 and 33 to which the cooling fins of this embodiment are applied generate about the same amount of heat. According the this embodiment, each of the cooling fins 71, 73 and 74 have a mounting density of elemental fins that is smaller at the lower portion of the support fin close to the fin base as compared with that at the upper portion of the support fin.

According to this embodiment, the cooling fluid flowing through the wide space above the cooling fins 71, 73 and 74 is faster than the flow on the lower layer side close to the mounting surface of the multi-layer ceramic board 2. But since elemental fins 713, 733 and 743 mounted to the upper portions of the support fins have a high mounting density, upon their contact with the said fast flow there arises a large flow resistance, thus allowing a larger amount of cooling fluid to flow for the elemental fins 713, 733 and 743 located at the lower portion close to the respective fin bases. Further, since the closer to the fin bases 711, 741 and 731, the smaller the mounting density of the elemental fins, the flow resistance on the lower layer side close to the surface of the multi-layer ceramic board 2, which carries a large number of semiconductor devices 31, 32 and 33 thereon, is suppressed to a relatively lower level than on the upper layer side. Thus, by providing such a varied mounting density of the elemental fins, an adequate amount of cooling fluid can flow at a sufficient flow rate for the lower elemental fins. Consequently, the rise in temperature of the cooling fluid heated and passed through the upper cooling fins is averaged and kept low in the whole cooling fin area. As a result, a large amount of cooling fluid having a high flowing velocity and a low temperature flows to the elemental fins near the fin bases, where temperature reduction is necessary. Thus, each cooling fin can effect efficient cooling.

Figure 4:
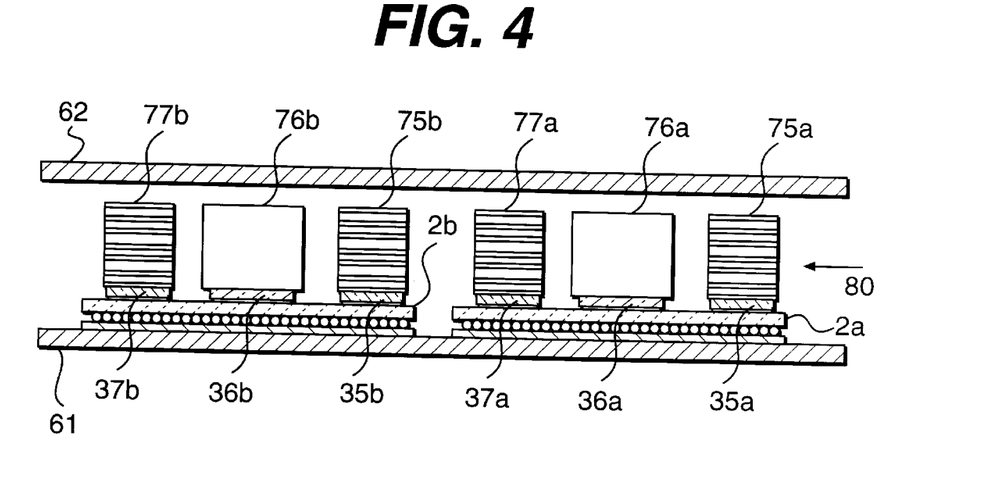
FIG. 4 is a vertical sectional view of a cooling apparatus for an electronic device according to a third embodiment of the present invention.
Figure 5:
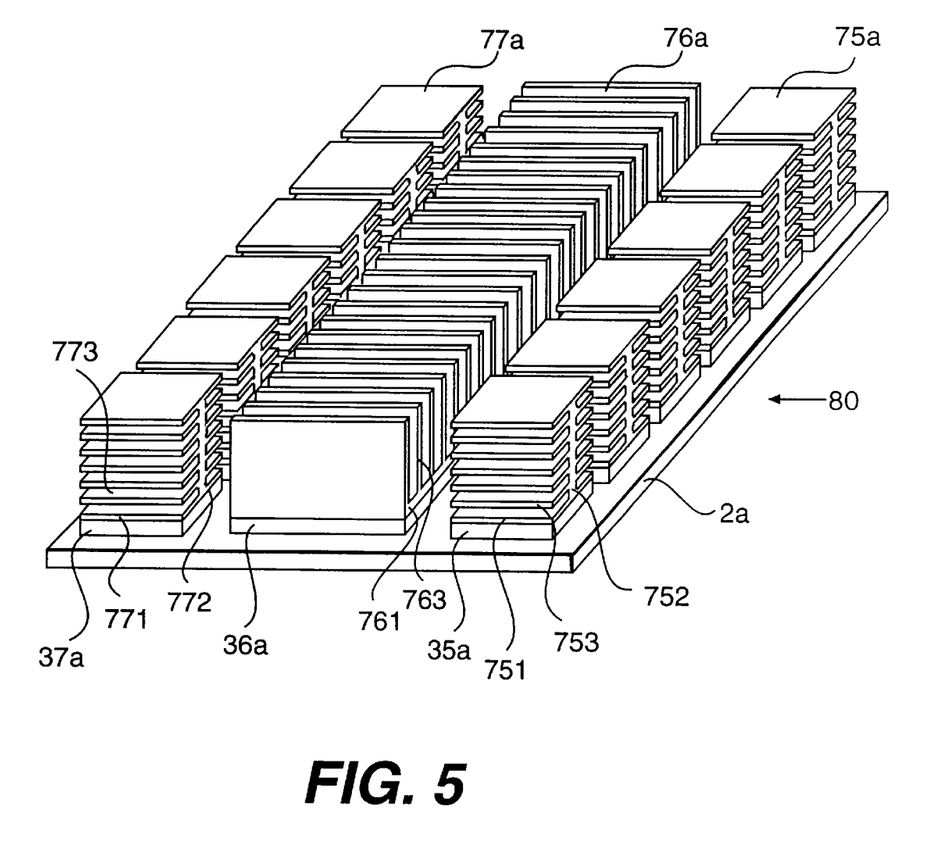
FIG. 5 is a perspective view showing a large number of semiconductor devices mounted on a multi-chip module, with cooling fins mounted onto the semiconductor devices.

A further embodiment will now be described with reference to FIGS. 4 and 5. FIG. 4 is a sectional view of a cooling apparatus for an electronic device to which this embodiment is applied, and FIG. 5 is a perspective view of the electronic device. According to this embodiment, a multi-chip module is mounted with a large number of semiconductor devices containing LSI chips, which produce high heat dissipation. Portions in this embodiment that are similar to portions described in FIGS. 1 and 2 are indicated by the same reference numerals and further explanation thereof is omitted.

As shown in FIG. 5, semiconductor devices 35a, 36a and 37a are arranged in three columns in the flowing direction of the cooling fluid, with cooling fins 72a, 76a and 77a being mounted thereon, respectively. The most upstream and downstream columns of semiconductor devices 35a, 37a are each provided with six semiconductor devices which are, for example, memories producing a small amount of heat. The cooling fins 75a and 77a mounted thereon are each composed of a support fin 752 (772) erected perpendicularly to its fin base and a large number of elemental fins 753 (773) parallel to the fin base. The mounting density of the elemental fins is uniform. On the other hand, the central column of semiconductor devices 36a are provided with three LSIs producing a larger amount of heat than the most upstream and downstream columns of semiconductor devices 35a, 37a. The cooling fins attached to the central column of semiconductor devices 36a include a large number of rectangular elemental fins 763 arranged vertically in parallel with fin bases 761. Thus, the most upstream and downstream columns of cooling fins 75a, 77a and the central column of cooling fins 76a are arranged in such a manner that the elemental fins 753, 773 and the elemental fins 763 intersect each other perpendicularly.

According to this embodiment, since the elemental fins 753, 763 and 773 are arranged in such a perpendicularly intersecting manner, there is neither parallel nor overlapped mode of arrangement in the flow direction 80 of the cooling fluid. Therefore, the cooling fluid flowing out from the upstream cooling fins and flowing to the downstream elemental fins flows over the surfaces of the elemental fins so as to always collide with the front ends of the downstream elemental fins. Thus, a leading edge effect of the flow and a flow mixing effect combine to exhibit remarkably enhanced cooling performance for the downstream elemental fins, thereby making it possible to minimize the difference in temperature of the semiconductor devices 35a, 36a and 37a. Although in this embodiment the many rectangular elemental fins 763 of each central column of cooling fins 76(a) are provided perpendicularly to the fin base 761, these fins may be substituted with the fins used in columns 75a and 76a, and vice versa, in order to achieve the same cooling effect.

A modification of the embodiment shown in FIG. 5 will be described below with reference to FIG. 6. In this embodiment, the portions similar to those in FIG. 5 are indicated by the same reference numerals and further explanation thereof is omitted.

Figure 6:
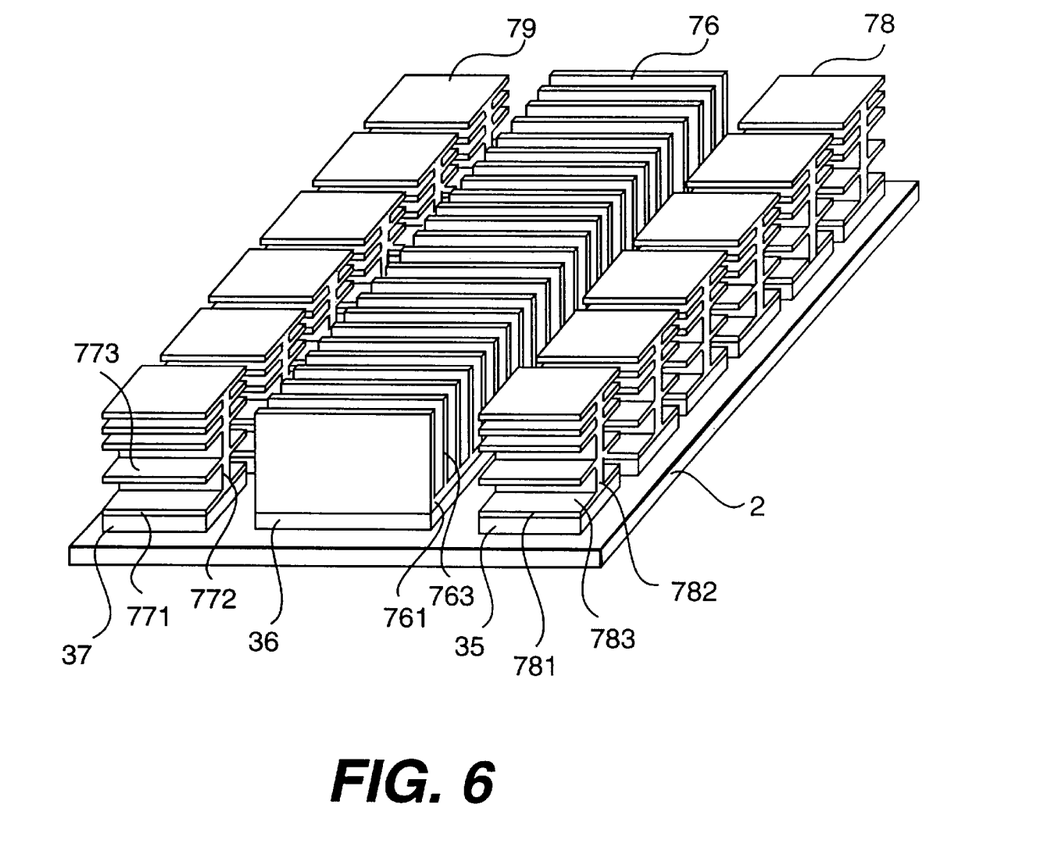
FIG. 6 is a perspective view of a cooling apparatus for an electronic device according to a fourth embodiment of the present invention, in which cooling fins are mounted onto a large number of semiconductor devices mounted on a multi-chip module.

As shown in FIG. 6, cooling fins 78 and 79 mounted to most upstream and downstream columns of semiconductor devices 35, 37 are of the same shape and construction as the most upstream and downstream columns of cooling fins 71, 73 (as shown in FIG. 2) and are each composed of a fin base 781 (791), a support fin 782 (792) erected perpendicularly to the fin base, and a large number of rectangular elemental fins 783 (793) which are parallel to the fin base. The mounting density of the elemental fins is smaller at the lower portion of the support fin close to the fin base as compared with the upper portion of the support fin. In other words, the number of elemental fins is smaller at the lower portion.

According to this embodiment, due to a synergistic effect of the orthogonal arrangement of the elemental fins of the upstream and downstream cooling fins and the low mounting density of the lower elemental fins close to the fin bases, the rise in temperature of the cooling fluid heated and flowing through the upstream cooling fins is averaged and kept low in the whole cooling fin area, whereby a cooling fluid having a high flowing velocity and low temperature can be allowed to flow in a large amount to the elemental fins located near the fin bases which are to be cooled. Consequently, each cooling fin can perform efficient cooling.

Figure 7:
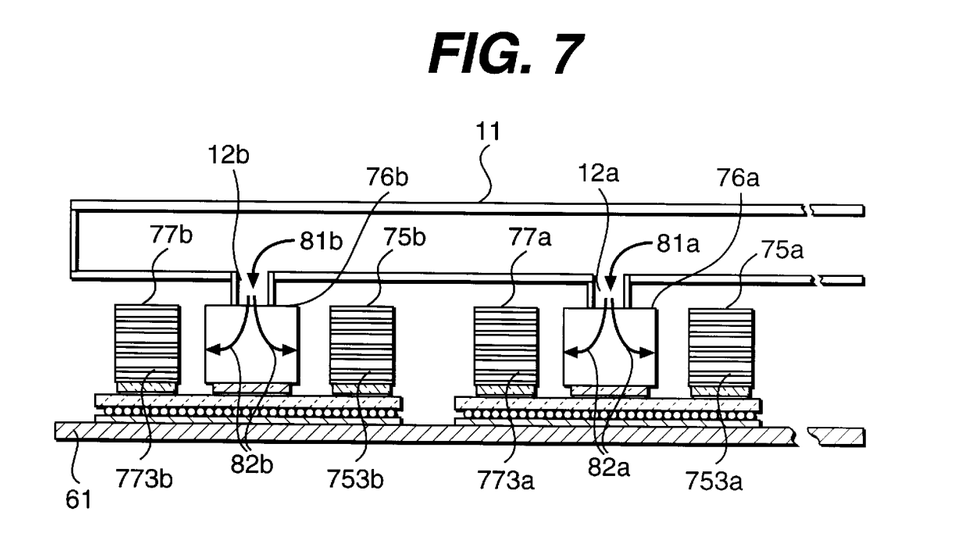
FIG. 7 is a vertical sectional view of a cooling apparatus for an electronic device according to a fifth embodiment of the present invention as a modification of the cooling apparatus of the third embodiment, illustrating the injection of a cooling fluid to cooling fins.

A modification of the embodiment shown in FIG. 4 is illustrated in FIG. 7. In the embodiment of FIG. 7, portions similar to those in FIG. 4 are indicated by the same reference numerals and further explanation thereof is omitted.

The embodiment illustrated in FIG. 7 contain a modification regarding how the cooling fluid for cooling the cooling fins flows. According to this embodiment, a change has been made from the previously disclosed method of flowing the cooling fluid in parallel with the cooling fins to a method of injecting the cooling fluid from just above the cooling fins. For this purpose, cooling fluid injection nozzles 12a and 12b are disposed in positions opposed to central columns of cooling fins 76a and 76b.

According to this embodiment, cooling fluid, as indicated with arrows 81a and 81b, impinges upon the many parallel, rectangular elemental fins of the central columns of cooling fins 76a and 76b and reaches the fin bases. Thereafter, the cooling fluid, as indicated with arrows 82a and 82b, enters the most upstream and downstream columns of cooling fins 75a, 77a, 75b, and 77b. At this time the cooling fluid flows at a high speed against elemental fins 753a, 773a, 753b and 773b located near the fin bases of the most upstream and downstream columns of cooling fins. Consequently, due to a synergistic effect resulting from this arrangement efficient cooling is obtained.

Although in this embodiment the cooling fluid is injected to the central column of cooling fins from the cooling fluid injection nozzles provided in the duct, an axial fan may be provided so as to cover the whole space above the cooling fins and cooling fluid may be injected to the central column of cooling fins.

Figure 8:
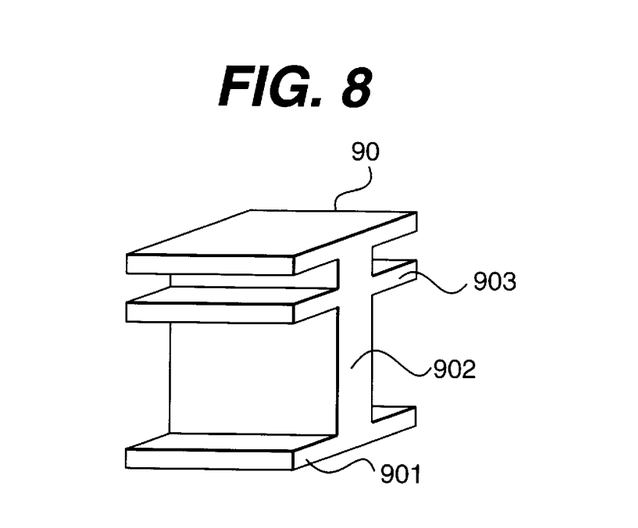
FIG. 8 is a perspective view of a cooling fin used in a cooling apparatus for an electronic device according to a sixth embodiment of the present invention.

Furthermore, in the embodiments illustrated in FIGS. 1, 2, 3 and 6, the rectangular elemental fins of the most upstream and downstream columns of cooling fins are mounted to the support fins erected perpendicularly to the respective fin bases and are parallel to the fin bases, and their mounting density is smaller at the lower portion of each fin base as compared with that at the upper portion of the fin base. However, a cooling fin 90 such as that shown in FIG. 8 may be employed instead, where no rectangular elemental fin is present at the lower portion close to the fin base. More specifically, in FIG. 8, no rectangular elemental fin 903, provided on a support fin 902 of a cooling fin 90, is provided at a lower portion close to a fin base 901.

Figure 10:
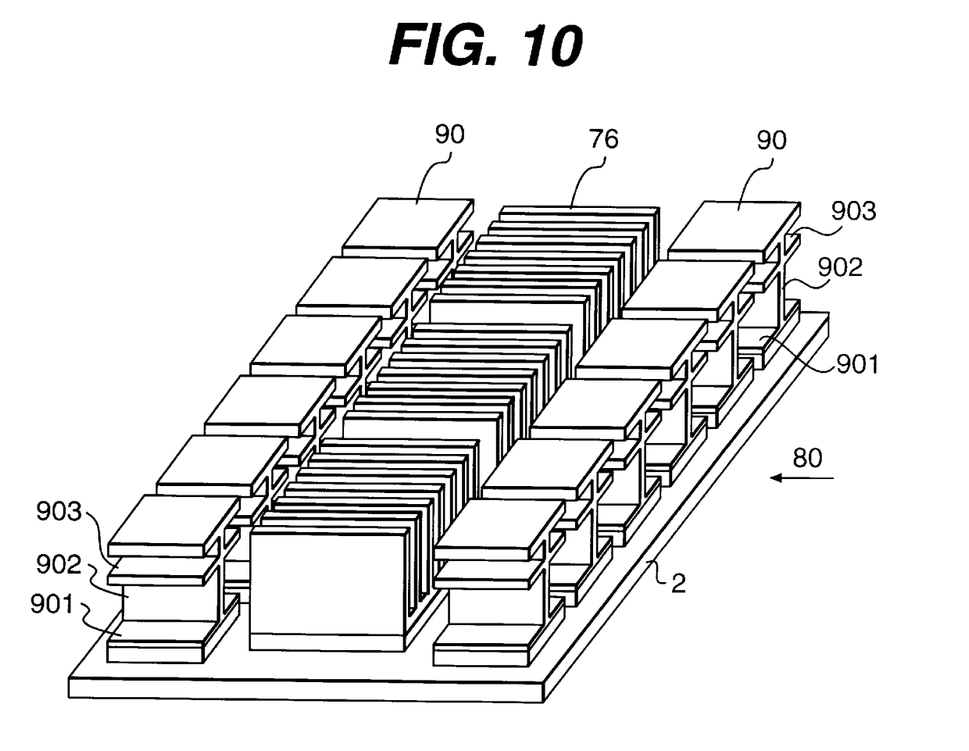
FIG. 10 is a perspective view of a cooling fin in which many of the fins illustrated in the sixth embodiment of the present invention have been modified.

FIG. 10 illustrates an embodiment in which a number of cooling fins 90 are installed. This embodiment is a modification of the embodiment shown in FIG. 6, where the cooling fins at the most upstream and most downstream sides are replaced with cooling fins 90. This permits the cooling fluid to flow at a higher speed through the lower portion near the fin base 91 and hence enhances the functions and effects described above.

In order to illustrate the cooling effect of the embodiment shown in FIG. 10, the following experiment was performed. The module shown in FIG. 10 was placed into an aeration passage having a height of 34 mm and a lateral width of 93 mm, and air was passed through at a rate of 0.8 m³/min. The six memory LSIs placed at the most upstream and most downstream sides generated heat amounting to 0.9 W. The three logic LSIs placed in the central row generated heat amounting to 13.5 W, 6.2 W and 5.6 W, respectively. The cooling fin for the memory LSIs has a lateral width of 10.4 mm, a depth of 15.6 mm and a height of 18.5 mm. The thickness of an elemental fin and a support fin was 0.8 mm. The space between the upper elemental fins is 1.6 mm and the space between the lower elemental fins is 14.3 mm. The cooling fins for the three logical LSIs provided at the central row have a lateral width of 22.4 mm, a depth of 18.2 mm, a height of 18.5 mm, a thickness of elemental fins of parallel flat plate of 0.8 mm, and a space between elemental fins of 1.6 mm. The number of the cooling fins is 10.

Figure 11:
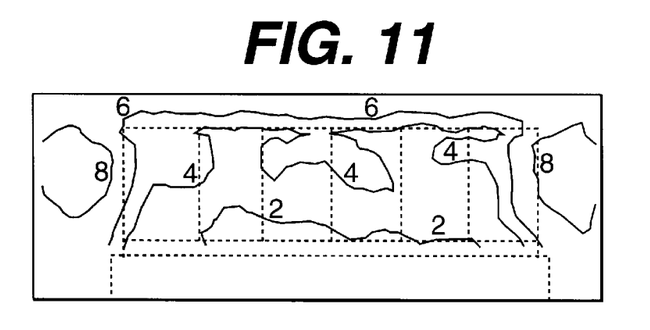
FIG. 11 is a graph illustrating the air speed distribution measured at an outlet of cooling air of the cooling unit for the electronic device according to the seventh embodiment of the present invention.
Figure 12:
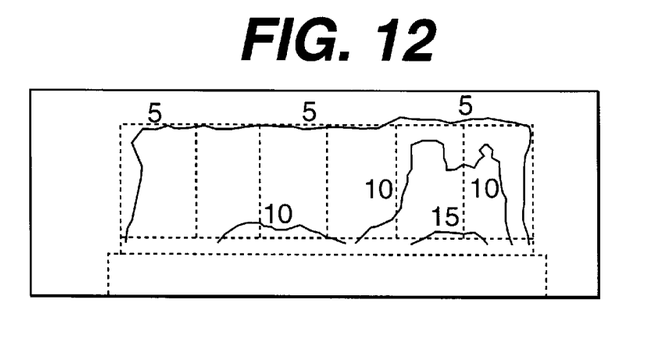
FIG. 12 is a graph illustrating the air temperature rise distribution as measured at an outlet of the cooling air according to the seventh embodiment of the present invention.

FIGS. 11 and 12 illustrate the air speed distribution and temperature rise measured at a cooling air outlet of the module as a result of the experiment discussed above. Numerals in FIG. 11 represent air speed values in units of m/s. Numerals in FIG. 12 show increased air temperature values in units of degrees C. Looking at the outlet of cooling air of the module, air of 2 to 4 m/s flows in an entire cooling fin region and even in case of the logical LSI having a high heat generation, since an air temperature is increased up to the upper ends of the parallel, rectangular elemental fins, it is apparent that the LSI is cooled by the entire cooling fin regions.

According to the present invention, it is first possible to let a cooling fluid having a high flow velocity and a low temperature flow near the fin bases where the temperature is to be reduced, whereby the temperature of the cooling fins can be kept low and the rise in temperature of semiconductor devices can be restricted within an allowable range. Also, it is possible to increase the heat dissipation generated from the semiconductor devices.

Second, the flow of cooling fluid entering the cooling fins positioned on the downstream side is no longer obstructed by the cooling fins located on the upstream side. Thus, cooling performance of the cooling fins positioned on the downstream side is improved, whereby semiconductor devices which produce high heat dissipation can be arranged and mounted side by side in a high mounting density.

Third, since all of the cooling fins can effect cooling in a uniform and averaged manner in the height direction from the semiconductor device mounted surface, the temperature of many semiconductor devices mounted on the multi-layer circuit board can be maintained easily within an allowable temperature range.

Fourth, since it is possible to ensure a satisfactory cooling performance of each cooling fin without increasing the number of elemental fins to a greater extent than necessary, the pressure resistance of the cooling fin itself decreases and hence the capacity of the fluid machine used such as a fan or a blower can be reduced to attain power saving, space saving, and the reduction of noise.

Fifth, it is possible to provide an electronic device cooling structure having a simple cooling fin structure.

While the present invention has been described above in connection with the preferred embodiments, one of ordinary skill in the art would be enabled by this disclosure to make various modifications to the preferred embodiments and still be within the scope and spirit of the present invention as embodied in the appended claims.

We claim:

1. In a cooling apparatus for an electronic device including cooling fins having a multitude of elemental fins and mounted to heat generating units of the electronic device, the cooling apparatus comprising:

a first cooling fin having a plurality of elemental fins arranged in uniform density from a fin base of the first cooling fin to a top portion of the first cooling fin; and a second cooling fin having a plurality of elemental fins arranged to have a first fin density at an upper portion of the second cooling fin and a second fin density at a lower portion, being close to a fin base, of the second cooling fin, wherein the second fin density is lower than the first fin density, and wherein the first and second cooling fins are mounted adjacent to one another.

2. A cooling apparatus for an electronic device according to claim 1, wherein the plurality of elemental fins of the first and second cooling fins are rectangular in shape and mounted in parallel relationship to one another on a support fin, wherein the support fin is erected on the fin base.

3. A cooling apparatus for an electronic device according to claim 1, wherein said plurality of elemental fins of the first and second cooling fins are in one of a circular shape and a rectangular shape.

4. In a cooling apparatus for an electronic device including cooling fins mounted to heat generating units of the electronic device, said cooling fins comprising a first cooling fin having a multitude of parallel, rectangular elemental fins attached perpendicularly to a fin base of the first cooling fin, and a second cooling fin having a plurality of parallel, rectangular elemental fins attached to a support fin, said support fin being erected perpendicularly to a fin base of the second cooling fin, wherein the first and second cooling fins are positioned adjacent to one another.

5. A cooling apparatus for an electronic device according to claim 4, wherein said plurality of elemental fins of the second cooling fin have a first fin density at an upper portion of the support fin and a second fin density at a lower portion of the support fin, and wherein the second fin density is lower than the first fin density.

6. A cooling apparatus for an electronic device according to claim 4, wherein said plurality of elemental fins of the second cooling fin have a first fin spacing between elemental fins at an upper portion of the second cooling fin that is smaller than a second fin spacing between elemental fins of a lower portion close to the fin base of the second cooling fin.

7. A cooling apparatus for an electronic device according to claim 4, wherein said plurality of elemental fins of the second cooling fin have a first thickness for elemental fins at an upper portion of the second cooling fin that is greater than a second thickness for elemental fins at a lower portion close to the fin base of the second cooling fin.

8. A cooling apparatus for an electronic device according to claim 4, wherein a cooling fluid is impinged onto the plurality of elemental fins of said first cooling fin from an upper portion of the first cooling fin so as to pass between adjacent ones of the plurality of elemental fins of said first cooling fin, and wherein after cooling the first cooling fin, the cooling fluid is allowed to flow to the second cooling fin.

9. A cooling apparatus for an electronic device according to claim 5, wherein a cooling fluid is impinged onto the plurality of elemental fins of said first cooling fin from an upper portion of the first cooling fin so as to pass between adjacent ones of the plurality of elemental fins of said first cooling fin, and wherein after cooling the first cooling fin, the cooling fluid is allowed to flow to the second cooling fin.

10. In a cooling apparatus for an electronic device having a cooling fin provided with a plurality of elemental fins and mounted to heat generating units of the electronic device, said cooling fin comprising elemental fins having a first fin density near an upper portion of the cooling fin and a second fin density near a lower portion of the cooling fin, wherein the second fin density is lower than the first fin density.

11. In a cooling fin in which a plurality of parallel, rectangular elemental fins are attached parallel to a fin base of the cooling fin and attached to a support fin mounted perpendicularly to the fin base, the elemental fins of the cooling fin having a first fin density at an upper portion of the cooling fin and a second fin density at a lower portion of the cooling fin, wherein the second fin density is lower than the first fin density.

12. A cooling apparatus according to claim 1, wherein the first and second cooling fins are arranged such that a cooling fluid passed through the cooling apparatus is subjected to a mixing effect due to interaction with the first and second cooling fins, thereby enhancing cooling of electronic devices.

13. In a cooling apparatus for an electronic device including cooling fins having a multitude of elemental fins and mounted to heat generating units of the electronic device, the cooling apparatus comprising:

a first cooling fin having a plurality of elemental fins arranged in uniform density from a fin base of the first cooling fin to a top portion of the first cooling fin;

a second cooling fin having a plurality of elemental fins arranged at an upper portion of the second cooling fin and no elemental fins at a lower portion, being close to a fin base, of the second cooling fin, and wherein the first and second cooling fins are mounted adjacent to one another.

14. In a cooling apparatus for an electronic device including cooling fins mounted to heat generating units of the electronic device, said cooling fins comprising a first cooling fin having a multitude of parallel, rectangular elemental fins attached perpendicularly to a fin base of the first cooling fin, and a second cooling fin having a plurality of parallel, rectangular elemental fins attached to a support fin, said support fin being erected perpendicularly to a fin base of the second cooling fin, wherein the first and second cooling fins are positioned adjacent to one another;

wherein said plurality of elemental fins of the second cooling fin are arranged at an upper portion of the support fin and no elemental fins are arranged at a lower portion of the support fin.

* * * * *